(12) United States Patent
Kojima et al.

(10) Patent No.: US 8,910,700 B2
(45) Date of Patent: Dec. 16, 2014

(54) MOLD, METHOD OF MANUFACTURING THE SAME, ARTICLE HAVING FINE UNEVEN STRUCTURE ON SURFACE, AND METHOD OF MANUFACTURING THE SAME

(75) Inventors: Katsuhiro Kojima, Otake (JP); Tadashi Nakamura, Tokyo (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 0 days.

(21) Appl. No.: 13/643,136

(22) PCT Filed: Apr. 22, 2011

(86) PCT No.: PCT/JP2011/059918
§ 371 (c)(1),
(2), (4) Date: Nov. 29, 2012

(87) PCT Pub. No.: WO2011/132771
PCT Pub. Date: Oct. 27, 2011

(65) Prior Publication Data
US 2013/0088784 A1    Apr. 11, 2013

(30) Foreign Application Priority Data

Apr. 22, 2010 (JP) ................................ 2010-098838

(51) Int. Cl.
| | | |
|---|---|---|
| B22D 7/10 | (2006.01) |
| C25D 11/04 | (2006.01) |
| C25D 11/24 | (2006.01) |
| B29D 11/00 | (2006.01) |
| G02B 1/11 | (2006.01) |
| B81C 99/00 | (2010.01) |
| B29C 33/42 | (2006.01) |
| G02B 27/00 | (2006.01) |
| C25D 11/12 | (2006.01) |

(52) U.S. Cl.
CPC ............. *G02B 1/118* (2013.01); *C25D 11/045* (2013.01); *C25D 11/24* (2013.01); *B29D 11/00788* (2013.01); *B29D 11/0048* (2013.01); *B81C 99/009* (2013.01); *B29C 33/424* (2013.01); *G02B 27/0006* (2013.01); *C25D 11/12* (2013.01)
USPC ................. 164/159; 164/456; 164/6; 164/15; 164/24; 425/412; 425/417; 425/358

(58) Field of Classification Search
USPC .................................. 164/456, 457, 6, 24, 72
See application file for complete search history.

(56) References Cited

U.S. PATENT DOCUMENTS

2005/0031856 A1* 2/2005 Kuo et al. ..................... 428/336
2006/0234396 A1* 10/2006 Tomita et al. .................... 438/3

FOREIGN PATENT DOCUMENTS

| JP | 2005-156695 | 6/2005 |
| JP | 2007-030146 | 2/2007 |
| WO | 2009/147858 | 12/2009 |

OTHER PUBLICATIONS

International Search Report dated Aug. 2, 2011 for PCT/JP2011/059918.

*Primary Examiner* — Jeffrey Wollschlager
*Assistant Examiner* — Stella Yi
(74) *Attorney, Agent, or Firm* — Morgan, Lewis & Bockius LLP (57) ABSTRACT

A mold in which a fine uneven structure is formed on the surface by anodizing a surface of an aluminum base material having a purity of equal to or more than 99.5% by mass, wherein a 60-degree gloss of the surface on the side where a fine uneven structure is formed is equal to or more than 750%.

1 Claim, 2 Drawing Sheets

MOLD, METHOD OF MANUFACTURING THE SAME, ARTICLE HAVING FINE UNEVEN STRUCTURE ON SURFACE, AND METHOD OF MANUFACTURING THE SAME

TECHNICAL FIELD

The present invention relates to a mold having a fine uneven structure on a surface thereof, a method of manufacturing the same, an article having a fine uneven structure on a surface thereof, and a method of manufacturing the same.

BACKGROUND ART

Recently, an article which has a fine uneven structure with a period that is equal to or less than the wavelength of visible light on a surface thereof has been known to exhibit an anti-reflection effect, a lotus effect and the like. In particular, an uneven structure referred to as a moth-eye structure in which convex portions of a substantially conical shape are aligned is known to serve as an effective anti-reflection means since a refractive index continuously increases from the refractive index of air to the refractive index of the material of the article.

As a method of forming a fine uneven structure on a surface of an article, a method of filling a liquid active energy beam-curable resin composition between a mold having a fine uneven structure on a surface thereof and a transparent base material, in which an active energy beam is irradiated thereto to cure the resin composition, and a cured resin layer in which a fine uneven structure is transferred onto a surface of the transparent base material is formed has drawn attention.

As the mold, a mold which has anodized alumina with plural fine pores on a surface of an aluminum base material has drawn attention since simple manufacture is possible (PTL 1).

When a fine uneven structure is formed by anodizing, use of an aluminum base material having surface gloss equal to or more than a predetermined value is disclosed in PTL 2.

The mold is manufactured through a manufacturing method having the following processes (a) to (f).

(a) A process of forming an oxide film by anodizing an aluminum base material in an electrolyte on a surface of the aluminum base material having a high purity which has been subjected to a cutting process.

(b) A process of removing the oxide film by immersing the aluminum base material in a mixture of chromic acid and phosphoric acid after process (a).

(c) A process of forming an oxide film having fine pores by re-anodizing the aluminum base material in the electrolyte after process (b).

(d) A process of increasing the diameter of the fine pores by immersing the aluminum base material in a solution that dissolves the oxide film after process (c).

(e) A process of re-anodizing the aluminum base material in the electrolyte after process (d).

(f) A process of repeating the processes (d) and (e) to obtain a mold in which anodized alumina with a plurality of fine pores having a shape in which the diameter continuously decreases from an opening portion in a depth direction (hereafter, referred as a tapered shape in some cases) is formed on the surface of the aluminum base material.

However, white streaks, which are considered to originate from cutting marks when the aluminum base material is subjected to the cutting process, are easily generated on a surface of the mold obtained by the above manufacturing method on the side where a fine uneven structure is formed. The higher the aluminum purity of the aluminum base material, the more likely it is that white streaks are generated.

When the fine uneven structure of the mold is transferred onto a surface of the transparent base material in a state in which white streaks are present, the white streaks are also transferred onto a surface of the transparent base material. The white streaks look white since white streaks scatter light, and an article with such white streaks transferred onto a surface thereof has high haze and, as a result, visible light transmittance is decreased.

In order to obtain an article (such as an anti-reflective article) with low haze and high visible light transmittance, it is necessary that white streaks not be generated on the surface of the mold on the side where a fine uneven structure is formed, or that the white streaks not be visually recognized, that is, it is necessary to provide a mold with high surface specularity (gloss).

CITATION LIST

Patent Literature

[PTL 1] Japanese Unexamined Patent Application, First Publication No. 2005-156695
[PTL 2] Japanese Unexamined Patent Application, First Publication No. 2007-30146

SUMMARY OF INVENTION

Technical Problem

The present invention provides a mold capable of obtaining an article with low haze and high visible light transmittance, and which has a fine uneven structure on a surface thereof, a method of manufacturing the same, an article having a fine uneven structure on a surface thereof, and a method of manufacturing the same.

Solution to Problem

The inventors have found that even when a precise specular working is performed on an aluminum base material, there is a tendency for white streaks to noticeably stand out in a mold in which a fine uneven structure is formed by anodizing. Furthermore, as a result of thorough investigation concerning the white streaks, the inventors have found that in the process (b) in which the oxide film is removed by immersing the aluminum base material in a mixture of chromic acid and phosphoric acid, it was possible to obtain a mold with high gloss in which the generation of white streaks is suppressed by ascertaining that the aluminum base material itself is eroded by the mixture of chromic acid and phosphoric acid to generate the white streaks, and adopting a condition of a new process (b) which is not present in the related art.

In other words, according to the present invention, a mold is provided in which a fine uneven structure is formed on a surface by anodizing a surface of an aluminum base material having a purity of equal to or more than 99.5% by mass, wherein a 60-degree gloss of the surface on the side where a fine uneven structure is formed is equal to or more than 750%.

A method of manufacturing a mold of the present invention includes (a) a process of forming an oxide film by anodizing an aluminum base material in an electrolyte on a surface of the aluminum base material having a purity of equal to or more than 99.5% by mass which has been subjected to a cutting process, (b) a process of removing the oxide film by immersing the aluminum base material in a mixture of chromic acid and phosphoric acid after process (a), (c) a process of forming an oxide film having fine pores by re-anodizing the aluminum base material in the electrolyte after process (b), (d) a process of increasing the diameter of the fine pores by immersing the aluminum base material in a solution that dissolves the oxide film after process (c), (e) a process of re-anodizing the aluminum base material in the electrolyte after process (d), and (f) a process of repeating processes (d) and (e) to obtain a mold in which anodized alumina having a plurality of fine pores is formed on the surface of the aluminum base material, in which the temperature of the mixture of chromic acid and phosphoric acid in the process (b) is 10 to 65° C., and the immersion time of the aluminum base material in the mixture of chromic acid and phosphoric acid in the process (b) is 0.5 to 10 hours.

According to the present invention, a method of manufacturing an article is provided having a fine uneven structure on a surface thereof which transfers the fine uneven structure on the surface of the mold in the present invention onto the surface of the transparent base material.

Advantageous Effects of Invention

According to the mold of the present invention, it is possible to obtain an article which has a fine uneven structure on the surface thereof with low haze and high visible light transmittance.

According to the method of manufacturing a mold of the present invention, it is possible to manufacture a mold capable of obtaining an article which has a fine uneven structure on the surface with low haze and high visible light transmittance.

According to the method of manufacturing an article which has a fine uneven structure on the surface of the present invention, it is possible to manufacture an article with low haze and high visible light transmittance.

DESCRIPTION OF EMBODIMENTS

In this specification, (meth)acrylate means acrylate or methacrylate. In addition, an active energy beam means visible light, an ultraviolet ray, an electron beam, plasma, a heat ray (an infrared ray), or the like. A fine uneven structure means a structure that has an average distance between convex portions or concave portions which is equal to or less than the wavelength of visible light, that is, equal to or less than 400 nm. A transparent base material means a base material capable of transmitting light.

<Mold>

A mold of the present invention is a mold in which a fine uneven structure is formed by anodizing a surface of an aluminum base material having a purity of equal to or more than 99.5%. The fine uneven structure is normally formed with plural fine pores which continuously decrease in diameter from an opening portion in a depth direction.

(Aluminum Base Material)

The shape of the aluminum base material may be a roll shape, a cylindrical shape, a plate shape, a sheet shape, or the like.

The purity of the aluminum is preferably equal to or more than 99.5% by mass, more preferably equal to or more than 99.8% by mass and even more preferably equal to or more than 99.9% by mass. When the purity of the aluminum is low, at the time of anodizing of the aluminum, an uneven structure with a size which scatters visible light due to the segregation of impurities is formed or the regularity of the fine pores obtained by anodizing may be lowered.

(Gloss)

The surface on the side where a fine uneven structure is formed of the mold in the present invention has a 60-degree gloss of equal to or more than 750%, and preferably equal to or more than 780%. When the 60-degree gloss is equal to or more than 750%, white streaks are not generated or cannot be visually recognized on the surface of the mold on the side where a fine uneven structure is formed, and an article which is obtained by transferring the fine uneven structure of the mold onto the surface of the transparent base material has low haze and high visible light transmittance.

A 60-degree gloss is measured using a gloss meter in accordance with JIS Z8741. Since a remarkable difference in gloss is shown depending on the presence or absence of white streaks, the measurement angle of gloss is set to 60°.

(Effect)

In the aforementioned mold of the present invention, since the 60-degree gloss of the surface on the side where a fine uneven structure is formed is equal to or more than 750%, little scattering of light occurs on the surface of the article obtained by transferring the fine uneven structure of the mold onto the surface of a transparent base material. For this reason, it is possible to obtain an article having a fine uneven structure on the surface with low haze and high visible light transmittance.

<Method of Manufacturing Mold>

The mold of the present invention is manufactured through a method having the following processes (a) to (f).

(a) a process of forming an oxide film by anodizing an aluminum base material in an electrolyte on a surface of the aluminum base material having a purity of equal to or more than 99.5% by mass which has been subjected to a cutting process.

(b) A process of removing the oxide film by immersing the aluminum base material in a mixture of chromic acid and phosphoric acid after process (a).

(c) A process of forming an oxide film having fine pores by re-anodizing the aluminum base material in the electrolyte after process (b).

(d) A process of increasing the diameter of the fine pores by immersing the aluminum base material in a solution that dissolves the oxide film after process (c).

(e) A process of re-anodizing the aluminum base material in the electrolyte after process (d).

(f) A process of repeating the processes (d) and (e) to obtain a mold in which anodized alumina having plural fine pores is formed on the surface of the aluminum base material.

Figure 1:
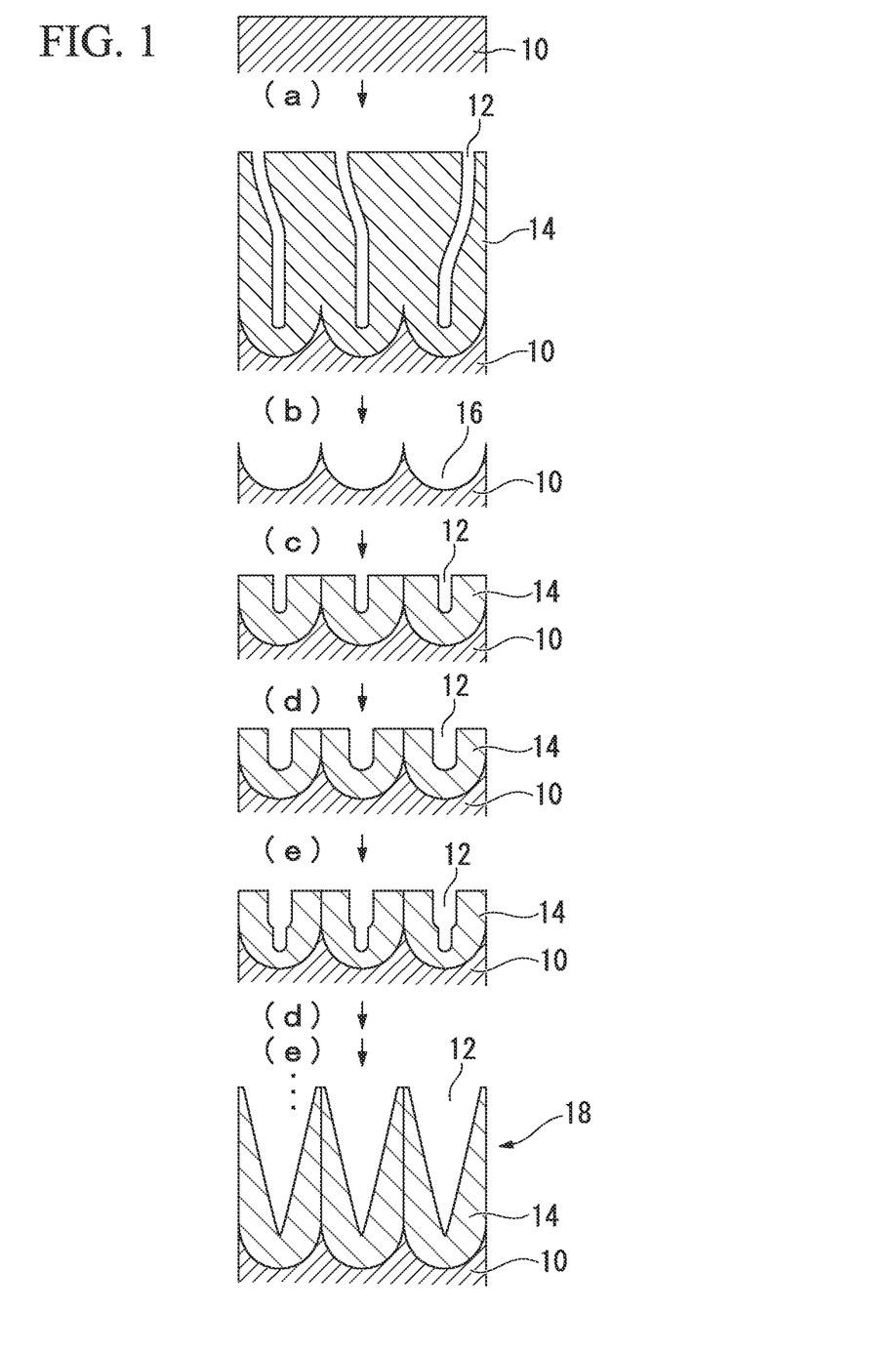
FIG. 1 is a cross-sectional view showing a process of manufacturing a mold which has anodized alumina on the surface.

Process (a):

As shown in FIG. 1, when the aluminum base material 10 which has been subjected to a cutting process is anodized under a constant voltage in an electrolyte, an oxide film 14 which has fine pores 12 is formed.

The aluminum base material shape may have a roll shape, a cylindrical shape, a plate shape, a sheet shape, or the like.

It is preferable to polish the aluminum base material using mechanical polishing, fabric polishing, chemical polishing, or an electrolytic polishing process (etching process) to smooth the surface. Since oil used in a cutting process to form a predetermined shape may adhere to the aluminum base material, it is preferable to perform a degreasing treatment on the aluminum base material in advance prior to anodization.

The purity of aluminum is equal to or more than 99.5% by mass, preferably equal to or more than 99.8% by mass, and even more preferably equal to or more than 99.9% by mass. When the purity of the aluminum is low, at the time of anodizing of the aluminum, an uneven structure with a size which scatters visible light due to the segregation of impurities is formed or the regularity of the fine pores obtained by anodizing may be lowered.

The electrolyte may be sulfuric acid, oxalic acid, phosphoric acid, or the like.

When Oxalic Acid is Used as an Electrolyte:

The concentration of oxalic acid is preferably equal to or less than 0.7 M. When the concentration of oxalic acid is more than 0.7 M, a current value is so high that the surface of the oxide film may become rough.

When a formation voltage is 30 to 60 V, it is possible to obtain anodized alumina having fine pores with high regularity at intervals of 100 nm. When the formation voltage is higher or lower than the above range, there is a tendency for the regularity to decrease.

The temperature of the electrolyte is preferably equal to or less than 60° C., and more preferably equal to or less than 45° C. When the temperature of the electrolyte is more than 60° C., a phenomenon, so-called "burning", occurs and thus, the fine pores are damaged or the regularity of the fine pores is disrupted due to melting of the surface.

When Sulfuric Acid is Used as an Electrolyte:

The concentration of sulfuric acid is preferably equal to or less than 0.7 M. When the concentration of sulfuric acid is more than 0.7 M, a current value is so high that it may be difficult to maintain a constant voltage.

When a formation voltage is 25 to 30 V, it is possible to obtain anodized alumina having fine pores with high regularity at intervals of 63 nm. When the formation voltage is higher or lower than the above range, there is a tendency for the regularity to decrease.

The temperature of the electrolyte is preferably equal to or less than 30° C., and more preferably equal to or less than 20° C. When the temperature of the electrolyte is more than 30° C., a phenomenon, so-called "burning", occurs so that the fine pores are damaged or the regularity of the fine pores is disrupted due to melting of the surface.

Process (b):

As shown in FIG. 1, it is possible to improve the regularity of the fine pores by temporarily removing the oxide film 14 to form anodized fine pore generation points 16.

Removing an oxide film is performed by using a mixture of chromic acid and phosphoric acid that selectively dissolves the oxide film without dissolving aluminum. In the present invention, it is possible to obtain a mold having a 60-degree gloss equal to or more than 750% by performing the process (b) under the following conditions.

The concentration of chromic acid in the mixture of chromic acid and phosphoric acid is preferably 0.1 to 10% by mass, more preferably 0.5 to 5.0% by mass, and even more preferably 1.0 to 2.5% by mass. The concentration of phosphoric acid in the mixture of chromic acid and phosphoric acid is preferably 0.1 to 20% by mass, more preferably 1.0 to 10% by mass, and even more preferably 2.0 to 8.0% by mass. When the concentration of chromic acid and phosphoric acid falls in the above range, it is possible to remove the oxide film while suppressing the generation of white streaks.

The temperature of the mixture of chromic acid and phosphoric acid is 10 to 65° C., and preferably 15 to 55° C. When the temperature of the mixture of chromic acid and phosphoric acid is equal to or more than 10° C., removing the oxide film does not take a long period of time. When the temperature of the mixture of chromic acid and phosphoric acid is equal to or less than 65° C., it is possible to remove the oxide film while suppressing white streak generation.

Immersion of the aluminum base material in the mixture of chromic acid and phosphoric acid is performed for 0.5 to 10 hours, preferably for 1 to 8 hours, and more preferably for 3 to 6 hours. When immersion is performed for equal to or more than 0.5 hours, the oxide film can be sufficiently removed. When immersion is performed for equal to or less than 10 hours, it is possible to remove the oxide film while suppressing white streak generation.

Process (c):

As shown in FIG. 1, when the aluminum base material 10 with the oxide film removed is anodized again, the oxide film 14 having cylindrical fine pores 12 is formed on the fine pore generation points 16.

Anodizing may be performed under the same conditions as the process (a). The longer the anodizing time is, the deeper the fine pores that can be obtained.

Process (d):

As shown in FIG. 1, a process of increasing the diameter of the fine pores 12 (hereafter, referred to as a fine pore diameter-increasing process) is performed. The fine pore diameter-increasing process is a process of increasing the diameter of the anodized fine pores through immersion in a solution that dissolves the oxide film. For example, the solution may be a phosphoric acid aqueous solution of about 5% by mass.

The longer the fine pore diameter-increasing process, the larger the fine pore diameter.

Process (e):

As shown in FIG. 1, when the aluminum is re-anodized, cylindrical fine pores 12 with a small diameter which extend from the bottom portions of the cylindrical fine pores 12 are further formed.

Anodizing may be performed under the same conditions as the process (a). The longer the anodizing time, the deeper the fine pores that can be obtained.

Process (f):

As shown in FIG. 1, when the fine pore diameter-increasing process in the process (d) and the anodizing in the process (e) are repeated, the oxide film 14 having tapered fine pores 12 is formed to obtain a mold 18 having anodized alumina (an aluminum porous oxide film (alumite)) on the surface of the aluminum base material 10 is obtained. It is preferable to finish the processes with the process (d) as the final process.

The number of repetitions is preferably equal to or more than three in total, and more preferably equal to or more than five. For equal to or less than two repetitions, since the diameter of the fine pores decreases discontinuously, the reflectance-reducing effect of the moth-eye structure manufactured using anodized alumina having fine pores is not sufficient.

The shape of the fine pores 12 may be a substantially conical shape, a pyramidal shape, a cylindrical shape, or the like and it is preferable to have a shape in which the cross-sectional area of the fine pore in a direction perpendicular to the depth direction continuously decreases from the outermost surface to the depth direction as in a conical shape and pyramidal shape.

The average interval between the fine pores 12 is equal to or less than the wavelength of the visible light, that is, equal to or less than 400 nm. The average interval between the fine pores 12 is preferably equal to or more than 20 nm.

The average interval between the fine pores 12 is obtained by measuring the interval between adjacent fine pores 12 (the distance from the center of a fine pore 12 to the center of an adjacent fine pore 12) at 50 points using electron microscope observation, and then averaging the values.

The depth of the fine pores 12 is preferably 80 to 500 nm, more preferably 120 to 400 nm, and particularly preferably 150 to 300 nm, when the average interval is 100 nm.

The depth of the fine pores 12 is the value obtained by measuring the distance between the lowermost portion of the fine pore 12 and the uppermost portion of a convex portion between the fine pores 12 when observed with an electron microscope at 30000-fold magnification.

The aspect ratios of fine pores 12 (depth of the fine pores/average interval between the fine pores) are preferably 0.5 to 5.0, more preferably 0.8 to 4.5, and particularly preferably 1.2 to 4.0.

The surface of the mold of the present invention obtained through such processes has the 60-degree gloss equal to or more than 750%. Since the generation of white streaks on the mold is suppressed, it is possible to obtain an article with low haze and high total light transmittance by using the mold.

The surface of the mold on the side where a fine uneven structure is formed may be treated with a mold release agent. It is preferable that the mold release agent have a functional group capable of forming a chemical bond with the anodized alumina of the aluminum base material.

The mold release agent may be silicone resin, fluorine resin, a fluorine compound, or the like, and a fluorine compound having a hydrolyzable silyl group is preferable. Commercially available fluorine compounds having a hydrolyzable silyl group may include fluoroalkyl silane, KBM-7803 (manufactured by Shin-Etsu Chemical Co., Ltd.), MRAF (Asahi Glass), OPTOOL HD1100, HD2100 series, AES4, AES6, DSX (manufactured by Daikin Industries, Ltd.), Novec EGC-1720 (manufactured by Sumitomo 3M), FS-2050 series (manufactured by Fluoro Technology) and the like.

A method of treatment with the mold release agent may be a method (1) or a method (2) described below and the method (1) is particularly preferable from a viewpoint that the surface of the mold on the side where a fine uneven structure is formed can be uniformly treated with the mold release agent.

(1) A method of immersing the mold main body in a diluted solution of the mold release agent.

(2) A method of applying the mold release agent or a diluted solution of the mold release agent to the surface of the mold on the side where a fine uneven structure is formed.

It is preferable that the method (1) have the following processes (g) to (l).

(g) A process of washing a mold with water.

(h) A process of removing water drops adhered to the surface of the mold by blowing air against the mold after process (g).

(i) A process of immersing the mold in a diluted solution having a hydrolyzable silyl group in which a fluorine compound has been diluted by a fluorine-based solvent.

(j) A process of slowly lifting the immersed mold from the solution.

(k) A process of optionally heating and humidifying the mold after process (j).

(l) A process of drying the mold main body.

Process (g):

Since the agents used when the fine uneven structure is formed (the phosphoric acid aqueous solution used in the fine pore diameter-increasing process and the like), impurities (dust and the like) and the like adhere to the mold, the agents, impurities and the like are removed by washing with water.

Process (h):

When water drops adhere to the surface of the mold, since the diluted solution in the process (i) is deteriorated, visible water drops are mostly removed by blowing air against the mold.

Process (i):

Examples of fluorine-based solvents for dilution include hydrofluoropolyether, perfluorohexane, perfluoromethylcyclohexane, perfluoro-1,3-dimethylcyclohexane, dichloropentafluoropropane and the like.

The concentration of the fluorine compound having a hydrolyzable silyl group is preferably 0.01 to 0.5% by mass in the diluted solution (100% by mass).

The immersion time is preferably 1 to 30 minutes.

The immersion temperature is preferably 0 to 50° C.

Process (j):

When lifting the immersed mold from the solution, it is preferable to suppress rocking at the time of lifting using an electric lifter at a constant rate. By doing this, the application nonuniformity can be reduced.

The lifting rate is preferably 1 to 10 mm/sec.

Process (k):

After the process (j), the mold may be heated and humidified. By leaving the mold in a state where it is heated and humidified, the hydrolyzable silyl group of the fluorine compound (mold release agent) is hydrolyzed to generate a silanol group, and a reaction of the silanol group and a hydroxyl group on the surface of the mold is sufficiently carried out to improve the fixing properties of the fluorine compound. As a humidifying method, a saturated salt method using a saturated aqueous salt solution, a method of humidifying by heating water, a method of directly blowing heated vapor against a mold, or the like can be considered. This process may be performed in a thermo-hygrostat.

The heating temperature is preferably 30 to 150° C.

The humidification condition is preferably a relative humidity equal to or more than 60%.

The exposure time is preferably 10 minutes to 7 days.

Process (l):

In the process of drying the mold, the mold may be air-dried or may be forcibly heat-dried using a drier.

The drying temperature is preferably 30 to 150° C.

The drying time is preferably 5 to 300 minutes.

Treating of the surface of the mold with the mold release agent can be confirmed by measuring a water contact angle of the surface of the mold. The water contact angle of the surface of a mold treated with the mold release agent is preferably equal to or more than 60°, and more preferably equal to or more than 90°. When the water contact angle is equal to or more than 60°, the surface of the mold has been sufficiently treated with the mold release agent so that the release properties thereof are favorable.

When the fine uneven structure of the mold is transferred onto the surface of the transparent base material, the initial release properties are made favorable by treating the surface of the mold on the side where a fine uneven structure is formed with the mold release agent capable of forming a chemical bond with the mold. Even when repeating the transferring, since it is difficult to lower release properties, an article which has a fine uneven structure on the surface can be manufactured with favorable productivity.

(Effect)

Since the concentration, temperature and immersion time of the mixture of chromic acid and phosphoric in the process (b) fall in a specific range, it is possible to suppress the generation of white streaks in the manufacturing of a mold of the present invention described above. Therefore, little scattering of light occurs on the surface of the article obtained by transferring the fine uneven structure of the mold onto the surface of the transparent base material so that it is possible to obtain an article having a fine uneven structure on a surface thereof with low haze and high visible light transmittance.

<Method of Manufacturing Article>

A method of manufacturing an article having a fine uneven structure on a surface thereof in the present invention is a method of transferring the fine uneven structure on the surface of the mold of the present invention onto the surface of the transparent base material. Specifically, there may be a method in which an active energy beam-curable resin composition is filled between the mold of the present invention and the transparent base material, an active energy beam is irradiated thereto to cure the resin composition, and a cured resin layer in which the fine uneven structure of the mold is transferred is formed on the surface of the transparent base material so that the transparent base material in which the cured resin layer is formed on the surface is separated from the mold (a so-called light-imprinting method).

(Transparent Base Material)

The shape of the base material may be a film, sheet, an injection molding, or a press molding.

The material of the base material may be, for example, a polycarbonate, a polystyrene resin, polyester, an acrylic resin, a cellulosic resin (triacetylcellulose and the like), polyolefin, glass, or the like.

(Manufacturing Apparatus)

The article having a fine uneven structure on the surface thereof is manufactured, for example, using the manufacturing apparatus shown in FIG. 2, as follows.

The active energy beam-curable resin composition is supplied between a roll-shaped mold 20 having a fine uneven structure on a surface thereof (not shown) and a band-shaped film 42 (transparent base material) moving along the surface of the roll-shaped mold 20 from a tank 22.

The film 42 and the active energy beam-curable resin composition are nipped between the roll-shaped mold 20 and a nip roll 26 with a nip pressure adjusted by a pneumatic cylinder 24 and the active energy beam-curable resin composition is filled in the concave portions of the fine uneven structure of the roll-shaped mold 20 while being uniformly diffused between the film 42 and the roll-shaped mold 20.

A cured resin layer 44 in which the fine uneven structure is transferred on the surface of the roll-shaped mold 20 is formed by irradiating an active energy beam to the active energy beam-curable resin composition for curing through the film 42 from an active energy beam irradiation device 28 disposed below the roll-shaped mold 20.

Figure 2:
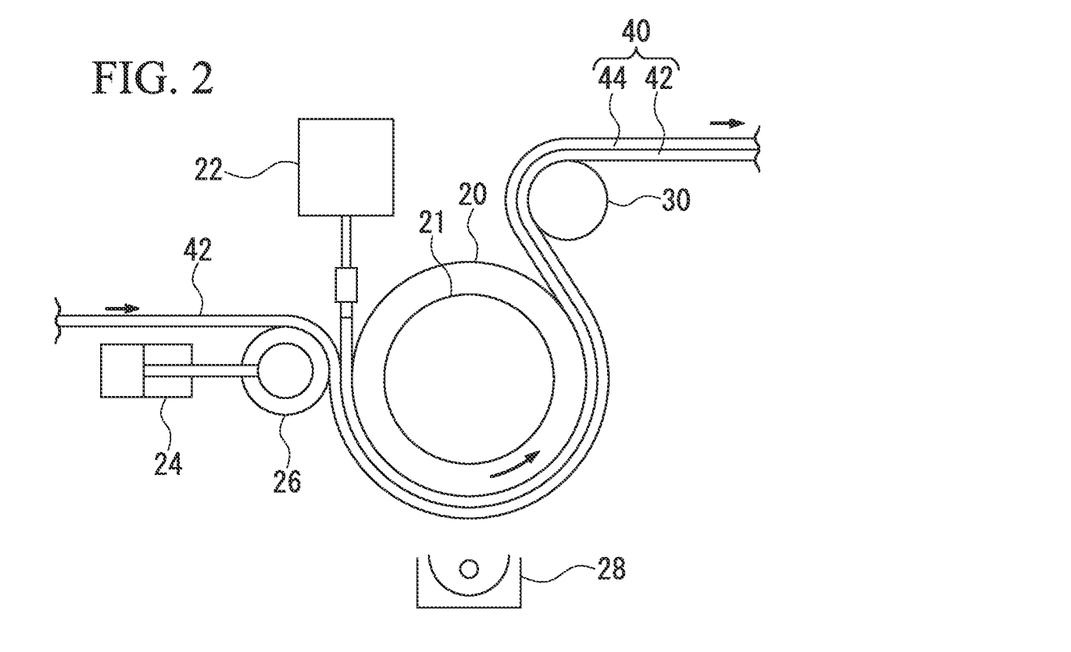
FIG. 2 is a configuration diagram showing an example of an apparatus for manufacturing an article which has a fine uneven structure on the surface.
Figure 3:
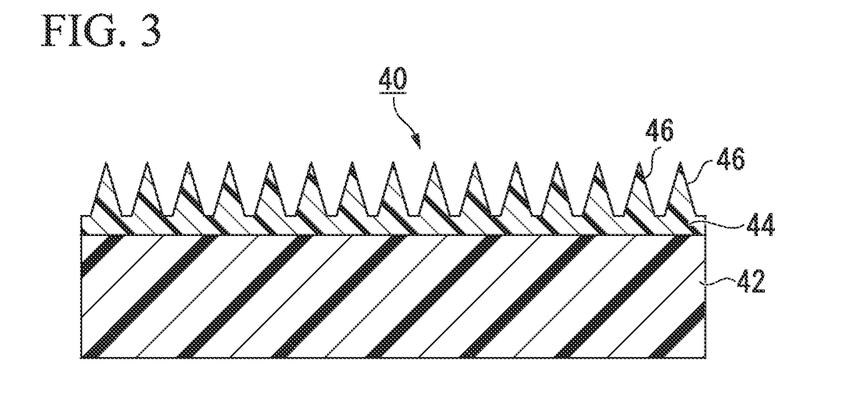
FIG. 3 is a cross-sectional view showing an example of an article which has a fine uneven structure on the surface.

An article 40 shown in FIG. 3 is obtained by separating the film 42 in which the cured resin layer 44 is formed on the surface from the roll-shaped mold 20 by a separating roll 30.

As the active energy beam irradiation device 28, a high-pressure mercury lamp and a metal halide lamp and the like are preferable and the light irradiation energy amount thereof is preferably 100 to 10000 mJ/cm$^2$.

The film 42 is a light-transparent film. The material of the film may be an acrylic resin, a polycarbonate, a styrene-based resin, polyester, a cellulosic resin (triacetylcellulose and the like), polyolefin, alicyclic polyolefin, or the like.

The cured resin layer 44 is a film made of a hardened material of an active energy beam-curable resin composition described later and has the fine uneven structure on the surface.

The fine uneven structure on the surface of the article 40 when anodized alumina mold is used is formed by transferring the fine uneven structure onto a surface of the anodized alumina, and has plural convex portions 46 made of a hardened material of an active energy beam-curable resin composition.

It is preferable that the fine uneven structure have a so-called moth-eye structure in which plural protrusions (convex portions) of a substantially conical shape, a pyramidal shape, or the like are aligned. The moth-eye structure which has an interval between protrusions equal to or less than the wavelength of visible light is known to be an effective antireflection means since the refractive index continuously increases from the refractive index of air to the refractive index of the material.

The average interval between the convex portions is preferably equal to or less than the wavelength of the visible light, that is, equal to or less than 400 nm. When the convex portions are formed using a mold of anodized alumina, since the average interval between the convex portions is about 100 nm, it is more preferable that the average interval be equal to or less than 200 nm, and particularly preferable that it be equal to or less than 150 nm.

The average interval between the convex portions is preferably equal to or more than 20 nm from a viewpoint of easy forming of the convex portions.

The average interval between the convex portions is obtained by measuring the interval between adjacent convex portions (the distance from the center of a convex portion to the center of a convex portion) at 50 points with electron microscope observation, and then averaging the values.

The height of the convex portions is preferably 80 to 500 nm, more preferably 120 to 400 nm, and particularly preferably 150 to 300 nm, when the average interval is 100 nm. When the height of the convex portions is equal to or more than 80 nm, reflectance is sufficiently low and the wavelength dependency of the reflectance is low. When the height of the convex portions is equal to or less than 500 nm, the scratch resistance of the convex portions is favorable.

The height of the convex portions is the value obtained by measuring the distance between the uppermost portion of the convex portion and the lowermost portion of a concave portion between the convex portions when observed with an electron microscope at 30000-fold magnification.

The aspect ratios of convex portions (height of the convex portions/average interval between the convex portions) are preferably 0.5 to 5.0, more preferably 0.8 to 4.5, and particularly preferably 1.2 to 4.0. When the aspect ratios of convex portions are equal to or more than 0.5, the cured resin layer can be sufficiently used as a super hydrophilic film or a super water-repellent film. When the aspect ratios of convex portions are equal to or less than 5.0, the scratch resistance of the convex portions is favorable.

The shapes of the convex portions are preferably shapes in which the cross-sectional areas of the convex portions in a direction perpendicular to the height direction continuously increase from the outermost surface to the depth direction, that is, the cross-sectional shapes of the convex portions in the height direction preferably have a triangular shape, a trapezoidal shape, a bell shape, or the like.

When manufacturing a low reflectance article, the difference between the refractive index of the cured resin layer 44 and the refractive index of the film 42 is preferably equal to or less than 0.2, more preferably equal to or less than 0.1, and particularly preferably equal to or less than 0.05. When the refractive index difference is equal to or less than 0.2, reflection at the interface of the cured resin layer 44 and the film 42 is suppressed.

When a surface has a fine uneven structure, it is known that when the surface is made of a hydrophobic material, super water repellency is acquired due to a lotus effect, and when the surface is made of a hydrophilic material, super hydrophilicity is acquired.

The water contact angle of the surface of a fine uneven structure when the cured resin layer 44 is made of a hydrophobic material is preferably equal to or more than 90°, more preferably equal to or more than 110°, and particularly preferably equal to or more than 120°. When the water contact angle is equal to or more than 90°, since water contaminants do not easily adhere to the surface, sufficient antifouling properties are exhibited. Further, since water is not easily adhered, anti-icing can be expected.

The water contact angle of the surface of a fine uneven structure when the cured resin layer 44 is made of a hydrophilic material is preferably equal to or less than 25°, more preferably equal to or less than 23°, and particularly preferably equal to or less than 21°. When the water contact angle is equal to or less than 25°, contaminants adhering to the surface can be washed away with water and oil contaminants do not easily adhere, and thereby sufficient antifouling properties are exhibited. It is preferable that the water contact angle be equal to or more than 3° from a viewpoint of suppressing deformation of the fine uneven structure due to absorption of the cured resin layer 44 and a reflectance increase due to the deformation.

(Active Energy Beam-Curable Resin Composition)

The active energy beam-curable resin composition includes a polymerizable compound and a polymerization initiator.

Examples of polymerizable compounds include monomers, oligomers and reactive monomers having radical polymerizable bonds and/or cationic polymerizable bonds in a molecule.

Examples of monomers having radical polymerizable bonds include monofunctional monomers and multifunctional monomers.

Examples of monofunctional monomers include (meth) acrylate derivatives such as methyl(meth)acrylate, ethyl (meth)acrylate, propyl(meth)acrylate, n-butyl(meth)acrylate, i-butyl(meth)acrylate, s-butyl(meth)acrylate, t-butyl (meth)acrylate, 2-ethylhexyl(meth)acrylate, lauryl(meth) acrylate, alkyl(meth)acrylate, tridecyl(meth)acrylate, stearyl (meth)acrylate, cyclohexyl(meth)acrylate, benzyl(meth) acrylate, phenoxyethyl(meth)acrylate, isobornyl(meth) acrylate, glycidyl(meth)acrylate, tetrahydrofurfuryl(meth) acrylate, allyl(meth)acrylate, 2-hydroxyethyl(meth)acrylate, hydroxypropyl(meth)acrylate, 2-methoxyethyl(meth)acrylate, 2-ethoxyethyl(meth)acrylate; (meth)acrylic acid and (meth)acrylonitrile; styrene derivatives such as styrene and α-methyl styrene; and (meth)acrylamide derivatives such as (meth)acrylamide, N-dimethyl(meth)acrylamide, N-diethyl (meth)acrylamide, and dimethylaminopropyl(meth)acrylamide. These substances may be independently used or two or more substances may be used together.

Examples of multifunctional monomers include bifunctional monomers such as ethylene glycol di(meth)acrylate, tripropylene glycol di(meth)acrylate, isocyanuric acid ethylene oxide denatured di(meth)acrylate, triethylene glycol di(meth)acrylate, diethylene glycol di(meth)acrylate, neopentylglycol di(meth)acrylate, 1,6-hexanediol di(meth)acrylate, 1,5-pentanediol di(meth)acrylate, 1,3-butylene glycol di(meth)acrylate, polybutylene glycol di(meth)acrylate, 2,2-bis(4-(meth)acryloxypolyethoxyphenyl) propane, 2,2-bis(4-(meth)acryloxyethoxyphenyl)propane, 2,2-bis(4-(3-(meth) acryloxy-2-hydroxy propoxy)phenyl)propane, 1,2-bis(3-(meth)acryloxy-2-hydroxy propoxy)ethane, 1,4-bis(3-(meth)acryloxy-2-hydroxy propoxy)butane, dimethylol tricyclo decane di(meth)acrylate, di(meth)acrylate of an ethylene oxide adduct of bisphenol A, di(meth)acrylate of propylene oxide adduct of bisphenol A, hydroxypivalic acid neopentylglycol di(meth)acrylate, divinylbenzene, and methylenebisacrylamide; trifunctional monomers such as pentaerythritol tri(meth)acrylate, trimethylol propane tri (meth)acrylate, trimethylol propane ethylene oxide denatured tri(meth)acrylate, trimethylol propane propylene oxide denatured triacrylate, trimethylol propane ethylene oxide denatured triacrylate, isocyanuric acid ethylene oxide denatured tri(meth)acrylate; tetrafunctional or higher monomers such as condensation reaction mixture of succinic acid/trimethylolethane/acrylic acid, dipentaerythritol hexa(meth)acrylate, dipentaerythritol penta(meth)acrylate, ditrimethylol propane tetra acrylate, and tetramethylol methane tetra(meth) acrylate; and bifunctional or higher urethane acrylates and bifunctional or higher polyester acrylates. These substances may be independently used or two or more substances may be used together.

Examples of monomers having cationic polymerizable bonds include monomers having an epoxy group, an oxetanyl group, an oxazolyl group and a vinyloxy group and monomers having an epoxy group are particularly preferable.

Examples of oligomers or reactive polymers include unsaturated polyesters, such as a condensate of unsaturated dicarboxylic acid and polyalcohol; and polyester(meth)acrylate, polyether(meth)acrylate, polyol(meth)acrylate, epoxy(meth) acrylate, urethane(meth)acrylate, a cationic polymerization type epoxy compound, and monomers which has radical polymerizable bonds in the side chain or copolymerization polymers of the aforementioned monomer.

When a photo-curing reaction is used, examples of photopolymerization initiators include carbonyl compounds such as benzoin, benzoinmethylether, benzoinmethylether, benzoinisopropylether, benzoinisobutylether, benzyl, benzophenone, p-methoxybenzophenone, 2,2-diethoxyacetophenone, α,α-dimethoxy-α-phenylacetophenone, methylphenylglyoxylate, ethylpenylglyoxylate, 4,4'-bis(dimethylamino)benzophenone, 2-hydroxy-2-methyl-1-phenylpropan-1-one; sulfur compounds, such as tetramethylthiurammonosulfide, tetramethylthiuramdisulfide; 2,4,6-trimethylbenzoyldiphenylphosphineoxide, and benzoyl diethoxyphosphineoxide. These compounds may be independently used or two or more compounds may be used together.

When an electron irradiation curing reaction is used, polymerization initiators include thioxanthones such as benzophenone, 4,4-bis(diethylamino)benzophenone, 2,4,6-trimethylbenzophenone, methylorthobenzoylbenzoate, 4-phenylbenzophenone, t-butylanthraquinone, 2-ethyl anthraquinone, 2,4-diethyl thioxanthone, isopropylthioxanthone, and 2,4-dichlorothioxanthone; acetophenones such as diethoxyacetophenone, 2-hydroxy-2-methyl-1-phenylpropan-1-one, benzyldimethylketal, 1-hydroxycyclohexyl-phenyl ketone, 2-methyl-2-morpholino(4-thio methylphenyl) propan-1-one, and 2-benzyl-2-dimethylamino-1-(4-morpholinophenyl)-butanone; benzoin ethers such as benzoinmethylether, benzomethylether, benzoinisopropylether, and benzoinisobutylether; acyl phosphine oxides such as 2,4,6-trimethylbenzoyldiphenylphosphineoxide, bis(2,6-dimethoxybenzoyl)-2,4,4-trimethylpentylphosphineoxide, and bis(2,4,6-trimethylbenzoyl)-phenyl phosphine oxide; methylbenzoylformate, 1,7-bisacridinylheptan, and 9-phenyl acridine. These substances may be independently used or two or more substances may be used together.

When a thermosetting reaction is used, examples of heat polymerization initiators include organic peroxides such as methylethylketoneperoxide, benzoylperoxide, dicumyl peroxide, t-butyl hydroperoxide, cumenehydroperoxide, t-butyl peroxyoctoate, t-butyl peroxybenzoate, lauroylperoxide; and azo compounds such as azobisisobutyronitrile; and redox polymerization initiators in which an amine such as N,N-dimethylaniline and N,N-dimethyl-p-toluidine is combined with the aforementioned organic peroxides.

The amount of the polymerization initiator is preferably 0.1 to 10 parts by mass based on 100 parts by mass of the polymerizable compound. When the amount of the polymerization initiator is less than 0.1 parts by mass, it is difficult to carry out polymerization. When the amount of the polymerization initiator is above 10 parts by mass, a curable film may be colored or mechanical strength may be lowered.

The active energy beam-curable resin composition may optionally include a non-reactive polymer, an active energy beam sol-gel reactive composite, an antistatic, an additive such as a fluorine compound for improving antifouling properties; fine molecules, and a small amount of solvent.

Examples of non-reactive polymers include acrylic resins, styrene-based resins, polyurethane, cellulosic resins, polyvinyl butyral, polyester, thermoplastic elastomers.

Examples of active energy beam sol-gel reactive composites include alkoxy silane compounds and alkyl silicate compounds.

Examples of alkoxysilane compounds include tetramethoxysilane, tetra-i-propoxysilane, tetra-n-propoxysilane, tetra-n-butoxysilane, tetra-sec-butoxysilane, tetra-t-butoxysilane, methyltriethoxysilane, methyltripropoxysilane, methyltributoxysilane, dimethyldimethoxysilane, dimethyldiethoxysilane, trimethylethoxysilane, trimethylmethoxysilane, trimethylpropoxysilane and trimethylbutoxy silane.

Examples of alkyl silicate compounds include methylsilicate, ethylsilicate, isopropylsilicate, n-propylsilicate, n-butylsilicate, n-pentylsilicate and acetylsilicate.

(Hydrophobic Material)

In order to make the water contact angle of the surface of the fine uneven structure of the cured resin layer equal to or more than 90°, it is preferable to use a composition including a fluorine-containing compound or a silicone-based compound as the active energy beam-curable resin composition to form a hydrophobic material.

Fluorine-Containing Compounds:

Examples of fluorine-containing compounds include fluorine-containing monomers, fluorine-containing silane-coupling agents, fluorine-containing surfactants and fluorine-containing polymer.

Examples of fluorine-containing monomers include fluoroalkyl group-substituted vinyl monomers and fluoroalkyl group-substituted ring-opening polymerizable monomers.

Examples of fluoroalkyl group-substituted vinyl monomers include fluoroalkyl group-substituted(meth)acrylates, fluoroalkyl group-substituted(meth)acrylamides, fluoroalkyl group-substituted vinyl ethers and fluoroalkyl group-substituted styrenes.

Examples of fluoroalkyl group-substituted ring-opening polymerizable monomers include fluoroalkyl group-substituted epoxy compounds, fluoroalkyl group-substituted oxetane compounds and fluoroalkyl group-substituted oxazoline compounds.

Examples of fluorine-containing silane coupling agents include 3,3,3-trifluoropropyltrimethoxysilane, 3,3,3-trifluoropropyltriacetoxysilane, dimethyl-3,3,3-trifluoropropylmethoxysilane and tridecafluoro-1,1,2,2-tetrahydrooctyltriethoxy silane.

Examples of fluorine-containing surfactants include fluoroalkyl group-containing anionic surfactants and fluoroalkyl group-containing cationic surfactants.

Examples of fluorine-containing polymers include polymers of fluoroalkyl group-containing monomers, a copolymer of fluoroalkyl group-containing monomers and poly(oxyalkylene) group-containing monomers, copolymers of fluoroalkyl group-containing monomers and cross-linking reaction group-containing monomers. The fluorine-containing polymers may be copolymers with another copolymerizable monomers.

Silicone-Based Compounds:

Examples of silicone-based compounds include (meth)acrylic denatured silicones, silicone resins and silicone-based silane coupling agents.

Examples of (meth)acrylic denatured silicones include silicone(di)(meth)acrylate, and for example, silicone diacrylate "x-22-164" or "x-22-1602" manufactured by Shin-Etsu Chemical Co., Ltd is preferably used.

(Hydrophilic Material)

In order to make the water contact angle of the surface of the fine uneven structure of the cured resin layer equal to or less than 25°, a composition at least containing a hydrophilic monomer is preferably used as the active energy beam-curable resin composition which is able to form a hydrophilic material. In addition, from the viewpoints of giving the scratch resistance and the water resistance, the composition more preferably contains a cross-linking multifunctional monomer. Furthermore, the hydrophilic monomer and the cross-linking multifunctional monomer may be the same (namely, a hydrophilic multifunctional monomer). Furthermore, the active energy beam-curable resin composition may also contain other monomers.

A composition containing a tetrafunctional or higher multifunctional (meth)acrylate, bifunctional or higher hydrophilic (meth)acrylate and, optionally a monofunctional monomer is more preferable as the active energy beam-curable resin composition capable of forming a hydrophilic material.

Examples of tetrafunctional or higher multifunctional (meth)acrylates include ditrimethylolpropanetetra(meth)acrylate, pentaerythritoltetra(meth)acrylate, pentaerythritolethoxytetra(meth)acrylate, dipentaerythritolhydroxypenta(meth)acrylate, dipentaerythritolhexa(meth)acrylate, a condensation reaction mixture with a molar ratio 1:2:4 of succinic acid/trimethylolethane/acrylic acid, urethane acrylates (EBECRYL220, EBECRYL1290, EBECRYL1290K, EBECRYL5129, EBECRYL8210, EBECRYL8301, KRM8200: manufactured by DAICEL-CYTEC Company LTD.), polyether acrylates (EBECRYL81: manufactured by DAICEL-CYTEC Company LTD.), denaturing epoxy acrylates (EBECRYL3416: manufactured by DAICEL-CYTEC Company LTD.) and polyester acrylates (EBECRYL450, EBECRYL657, EBECRYL800, EBECRYL810, EBECRYL811, EBECRYL812, EBECRYL1830, EBECRYL845, EBECRYL846, EBECRYL1870: manufactured by DAICEL-CYTEC Company LTD.). The compound may be independently used or two or more of the compounds may be used together.

A pentafunctional or higher multifunctional (meth)acrylate is more preferable as the tetrafunctional or higher multifunctional (meth)acrylate.

The ratio of the tetrafunctional or higher multifunctional (meth)acrylate is preferably 10 to 90% by mass, more preferably 20 to 90% by mass, and particularly preferably 30 to 90% by mass. When the ratio of the tetrafunctional or higher multifunctional (meth)acrylate is equal to or more than 10% by mass, the elastic modulus is high and the scratch resistance is improved. When the ratio of the tetrafunctional or higher multifunctional (meth)acrylate is equal to or less than 90% by mass, it is difficult to form small cracks on the surface and for appearance defects to occur.

Examples of bifunctional or higher hydrophilic (meth)acrylates include multifunctional acrylates and polyethylene glycol dimethacrylates having long chain polyethylene glycol such as Aronix M-240 and Aronix M260 (manufactured by Toagosei Co., Ltd.) and NK Ester AT-20E and NK Ester ATM-35E (manufactured by Shin-Nakamura Chemical Co., Ltd.). These substances may be independently used or two or more of these substances may be used together.

In polyethylene glycol dimethacrylate, the total of average repeating units in polyethylene glycol chains present in a molecule is preferably 6 to 40, more preferably 9 to 30 and particularly preferably 12 to 20. When the average number of repeating units in the polyethylene glycol chains is equal to or more than 6, hydrophilicity is sufficient and antifouling properties are improved. When the average repeating units in the polyethylene glycol chains is equal to or less than 40, the compatibility with tetrafunctional or higher multifunctional (meth)acrylate becomes favorable and the active energy beam-curable resin composition is difficult to separate.

The ratio of bifunctional or higher hydrophilic(meth)acrylate is preferably 3 to 90% by mass and more preferably 3 to 70% by mass. When the ratio of bifunctional or higher hydrophilic(meth)acrylate is equal to or more than 3% by mass, hydrophilicity is sufficient and the antifouling properties are improved. When the ratio of bifunctional or higher hydrophilic(meth)acrylate is equal to or less than 90% by mass, elastic modulus is increased and the scratch resistance is improved.

A hydrophilic monofunctional monomer is preferable for the monofunctional monomer.

Examples of hydrophilic monofunctional monomers include monofunctional (meth)acrylates having a polyethylene glycol chain on an ester group such as M-20G, M-90G and M-230G (manufactured by Shin-Nakamura Chemical Co., Ltd.), monofunctional (meth)acrylates having a hydroxyl group on an ester group such as hydroxyalkyl(meth) acrylates, and cationic monomers such as monofunctional acrylamides, methacrylamidopropyltrimethylammonium methyl sulfate and methacryloyloxyethyltrimethylammonium methyl sulfate.

Moreover, viscosity adjusters such as acryloylmorpholine and vinylpyrrolidone, and adhesion improvers such as acryloylisocyanate which improve adhesion to an article body, and the like may also be used as monofunctional monomers.

The ratio of the monofunctional monomer is 0 to 20% by mass and more preferably 5 to 15% by mass. Adhesion between the base material and the curable resin is improved by using the monofunctional monomer. When the ratio of the monofunctional monomer is equal to or less than 20% by mass, the antifouling properties or the abrasion resistance is sufficiently exhibited without a shortage of tetrafunctional or higher multifunctional (meth)acrylate or bifunctional or higher hydrophilic(meth)acrylate.

The monofunctional monomer may be mixed by 0 to 35 parts by mass to an active energy beam-curable resin composition as a copolymer having a low degree of polymerization (co)polymerized with one, or two or more kinds. Examples of polymers having a low degree of polymerization include 40/60 copolymer oligomers (MG polymer manufactured by MRC Unitech) of monofunctional (meth)acrylates having a polyethylene glycol chain in an ester group such as M-230G (manufactured by Shin-Nakamura Chemical Co., Ltd) and methacrylamide propyltrimethyl ammonium methyl sulfate.

(Application)

As an application of the article 40, there are examples of an anti-reflective article, an anti-fogging article, an anti-fouling article, and a water-repellent article, more specifically, anti-reflection for a display device, a meter cover of a vehicle, a mirror of a vehicle, a window of a vehicle, a light extraction efficiency improving member of an organic or inorganic electroluminescence, a solar cell member and the like.

(Effect)

In the aforementioned method of manufacturing an article having a fine uneven structure on a surface thereof in the present invention, since the fine uneven structure on the surface of the mold of the present invention is transferred onto a surface of a transparent base material, it is possible to manufacture an article with low haze and high visible light transmittance. When an optical film in which streak-like defects like white streaks occur is used in a liquid crystal electronic display device, or the like, interference spots referred to as "moire" occur due to an interaction of the structure pitch of other optical films and the pixel pitch of a liquid crystal display panel. However, since white streak generation is suppressed in an optical film manufactured using the mold according to the present invention, it is possible to suppress the generation of moire when an electronic display device is used.

The article having a fine uneven structure on the surface thereof is not limited to the article 40 in the illustration examples. For example, the fine uneven structure may not be provided on the cured resin layer 44 and may be directly formed on the surface of the film 42 by a light-imprinting method. However, from a viewpoint that the fine uneven structure can be effectively formed using a roll-shaped mold 20, it is preferable to form the fine uneven structure on the surface of the cured resin layer 44.

EXAMPLES

Although the present invention is described in detail by Examples, the present invention is not limited thereto.

(Fine Pores of Anodized Alumina)

A part of the anodized alumina was cut, platinum was vapor-deposited on the cross-section thereof for one minute and the cross-section was observed using a field emission-type scanning electron microscope (manufactured by JEOL Ltd., JSM-7400F) under conditions of an accelerating voltage of 3.00 kV, whereby the intervals between the fine pores and the depth of the fine pores were measured. Each of the measurements was performed for fifty points, and the average was calculated.

(60-Degree Gloss)

A 60-degree gloss was measured 10 times using a gloss meter (manufactured by Konica Minolta Sensing, Inc., GM-268) and the average thereof was calculated.

(Total Light Transmittance and Haze)

The total Light Transmittance and haze of the article are measured by using a haze meter in accordance with JIS K 7361-1 (manufactured by Suga Test Instruments Co., Ltd.).

(Preparation of Active Energy Beam-Curable Composition A)

45 parts by mass of a condensation reaction mixture with a mole ratio of 1:2:4 of succinic acid/trimethylolethane/acrylic acid, 45 parts by mass of 1,6-hexanediol diacrylate (manufactured by Osaka Organic Chemical Industry Ltd.), 10 parts by mass of radical-polymerizable silicone oil (manufactured by Shin-Etsu Chemical Co., Ltd, X-22-1602), and 3 parts by mass of 1-hydroxy cyclohexyl phenyl ketone (manufactured by Ciba Specialty Chemical Corporation, Irugacure 184).

(Preparation of Active Energy Beam-Curable Composition B)

65 parts by mass of a condensation reaction mixture with a mole ratio of 1:2:4 of succinic acid/trimethylolethane/acrylic acid, 35 parts by mass of polyethylene glycol diacrylate (manufactured by Toagosei Co., Ltd., Aronix M260), and 3 parts by mass of 1-hydroxy cyclohexyl phenyl ketone (manufactured by Ciba Specialty Chemical Corporation, Irugacure 184).

(Preparation of Active Energy Beam-Curable Composition C)

65 parts by mass of a condensation reaction mixture with a mole ratio of 1:2:4 of succinic acid/trimethylolethane/acrylic acid, 25 parts by mass of 1,6-hexanediol diacrylate (manufactured by Osaka Organic Chemical Industry Ltd.), 10 parts by mass of radical-polymerizable silicone oil (manufactured by Shin-Etsu Chemical Co., Ltd, X-22-1602), and 3 parts by mass of 1-hydroxy cyclohexyl phenyl ketone (manufactured by Ciba Specialty Chemical Corporation, Irugacure 184).

Example 1

An aluminum base material was obtained by cutting an aluminum ingot with a purity of 99.99% into a cylindrical shape with an external diameter of 200 mm, an internal diameter of 155 mm, and a length of 350 mm, and performing a mirror surface cutting process on the surface so that the arithmetic mean roughness Ra of the surface to be processed was equal to or less than 0.03 µm. The measured 60-degree gloss of the surface was 896%.

Process (a):

The aluminum base material was anodized for 30 minutes in a 0.3 M aqueous oxalic acid solution under conditions of a direct current of 40 V and temperature of 16° C., thereby forming an oxide film (thickness: 3 μm).

Process (b):

The aluminum base material in which the oxide film was formed was immersed in an aqueous mixed solution of 6% by mass of phosphoric acid and 1.8% by mass of chromic acid adjusted to 50° C. for 2 hours, thereby removing the formed oxide film.

Process (c):

The aluminum base material was re-anodized for 45 seconds under the same conditions as the process (a), thereby forming an oxide film.

Process (d):

The aluminum base material in which the oxide film was formed was immersed in an aqueous mixed solution (30° C.) of 5% by mass of phosphoric acid for 9 minutes, thereby performing a fine pore diameter-increasing process which increases the fine pore diameter of the oxide film.

Process (e):

The aluminum base material was re-anodized for 45 seconds under the same conditions as the process (a).

Process (f):

The processes (d) and (e) were repeated 4 times in total and the process (d) was finally performed, thereby obtaining a roll-shaped mold in which anodized alumina having fine pores of a substantially conical shape at average intervals of 100 nm and depth of 170 nm was formed on the surface.

The roll-shaped mold was immersed in 0.1% by mass of a diluted solution of a mold release agent for 10 minutes, air-dried for 24 hours, and treated with a mold release agent (manufactured by Daikin Industries, Ltd, Optool DSX.). The measured 60-degree gloss of the surface was 808%.

Example 2

An aluminum base material was obtained by cutting an aluminum ingot with a purity of 99.97% into a cylindrical shape with an external diameter of 200 mm, an internal diameter of 155 mm, and a length of 350 mm, and performing a mirror surface cutting process on the surface so that the arithmetic mean roughness Ra of the surface to be processed was equal to or less than 0.02 μm. The measured 60-degree gloss of the surface was 899%.

Process (a):

The aluminum base material was anodized for 30 minutes in a 0.3 M aqueous oxalic acid solution under conditions of a direct current of 40 V and temperature of 16° C., thereby forming an oxide film (thickness: 3 μm).

Process (b):

The aluminum base material in which the oxide film was formed was immersed in a mixture of chromic acid and phosphoric acid (an aqueous solution containing 6% by mass of phosphoric acid and 1.8% by mass of chromic acid) adjusted to 35° C. for 4 hours, thereby removing the formed oxide film.

Process (c):

The aluminum base material was re-anodized for 40 seconds under the same conditions as the process (a), thereby forming an oxide film.

Process (d):

The aluminum base material in which the oxide film was formed was immersed in an aqueous mixed solution (30° C.) of 5% by mass of phosphoric acid for 8 minutes, thereby performing a fine pore diameter-increasing process which increases the fine pore diameter of the oxide film.

Process (e):

The aluminum base material was re-anodized for 40 seconds under the same conditions as the process (a).

Process (f):

The processes (d) and (e) were repeated 4 times in total and the process (d) was finally performed, thereby obtaining a roll-shaped mold in which anodized alumina having fine pores of a substantially conical shape at average intervals of 100 nm and depth of 170 nm was formed on the surface.

The roll-shaped mold was immersed in 0.1% by mass of a diluted solution of a mold release agent for 10 minutes, air-dried for 24 hours and treated with a mold release agent (manufactured by Daikin Industries, Ltd, Optool DSX.). The measured 60-degree gloss of the surface was 819%.

Example 3

A roll-shaped mold was obtained under the same conditions as Example 2, except for adjusting the temperature in the process (b) to 23° C. The results are shown in Table 1.

Example 4

A roll-shaped mold was obtained in the same manner as Example 1 except for using a mixture of chromic acid and phosphoric acid (an aqueous solution containing 8% by mass of phosphoric acid and 1.1% by mass of chromic acid) in the process (b). The results are shown in Table 1.

Example 5

A roll-shaped mold was obtained in the same manner as Example 1 except for using a mixture of chromic acid and phosphoric acid (an aqueous solution containing 4% by mass of phosphoric acid and 2.3% by mass of chromic acid) in the process (b). The results are shown in Table 1.

Example 6

A roll-shaped mold was obtained in the same manner as Example 2 except for using a mixture of chromic acid and phosphoric acid (an aqueous solution containing 5% by mass of phosphoric acid and 1.5% by mass of chromic acid), adjusting the temperature to 65° C., and performing immersing for 1 hour in the process (b). The results are shown in Table 1.

Example 7

A roll-shaped mold was obtained in the same manner as Example 1 except for using a mixture of chromic acid and phosphoric acid (an aqueous solution containing 9% by mass of phosphoric acid and 2.0% by mass of chromic acid), adjusting the temperature to 15° C., and performing immersing for 8 hours in the process (b). The results are shown in Table 1.

Comparative Example 1

A roll-shaped mold was obtained in the same manner as Example 1 except for adjusting the temperature to 70° C. in the process (b). The results are shown in Table 1.

Comparative Example 2

A roll-shaped mold was obtained in the same manner as Example 2 except for adjusting the temperature to 70° C. in the process (b). The results are shown in Table 1.

Comparative Example 3

A roll-shaped mold was obtained in the same manner as Example 2 except for adjusting the temperature to 5° C. and performing immersing for 0.5 hours in the process (b). The results are shown in Table 1.

TABLE 1

|  | Arithmetic mean roughness Ra of Surface to Be Processed (μm) | Concentration of Chromic Acid (% by mass) | Concentration of Phosphoric Acid (% by mass) | Temperature of Process (b) (° C.) | Immersion time of Process (b) (hours) | 60-degree Gloss Before Mold Releasing Agent Treatment (%) | 60-degree Gloss Before Mold Releasing Agent Treatment (%) |
|---|---|---|---|---|---|---|---|
| Example 1 | 0.025 | 1.8 | 6 | 50 | 2 | 896 | 808 |
| Example 2 | 0.018 | 1.8 | 6 | 35 | 4 | 899 | 819 |
| Example 3 | 0.013 | 1.8 | 6 | 23 | 4 | 899 | 825 |
| Example 4 | 0.022 | 1.1 | 8 | 50 | 2 | 899 | 775 |
| Example 5 | 0.024 | 2.3 | 4 | 50 | 2 | 896 | 780 |
| Example 6 | 0.016 | 1.5 | 5 | 65 | 1 | 899 | 790 |
| Example 7 | 0.022 | 2.0 | 9 | 15 | 8 | 896 | 820 |
| Comparative Example 1 | 0.024 | 1.8 | 6 | 70 | 2 | 896 | 644 |
| Comparative Example 2 | 0.017 | 1.8 | 6 | 70 | 2 | 899 | 605 |
| Comparative Example 3 | 0.014 | 1.8 | 8 | 5 | 0.5 | 899 | 700 |

Example 8

The roll-shaped mold obtained in Example 1 was installed in a manufacturing apparatus shown in FIG. 2 to manufacture an article as follows.

As shown in FIG. 2, the roll-shape mold 20 was fitted into a shaft core 21 made of carbon steel for machine structural use in which a flow path for cooling water was provided. In addition, the active energy beam-curable composition A was supplied from a tank 22 onto the film 42 (polyethylene terephthalate (PET) film, manufactured by Toyobo Co., Ltd, A4300) nipped between a nip roll 26 and the roll-shaped mold 20 through a supply nozzle at the room temperature. At this time, the active energy beam-curable composition was nipped by the nip roll 26 for which nip pressure was adjusted by the pneumatic cylinder 24 and the active energy beam-curable composition was filled into the fine pores (concave portions) of the roll-shaped mold 20.

Ultraviolet light was irradiated from an active energy beam irradiation device 28 (240 W/cm ultraviolet irradiation device) in a state in which the active energy beam-curable composition A was interposed between the roll-shaped mold 20 and the film 42 while rotating the roll-shaped mold 20 at a rotating rate of 7.0 m/min to cure the active energy beam-curable composition A and form the cured resin layer 44, followed by separating the film 42 having the cured resin layer 44 formed on the surface thereof from the roll-shaped mold 20 by the separating roller 30 to obtain the article 40 having a fine uneven structure on the surface thereof. The results are shown in Table 2.

Example 9

As the film 42, an article having a fine uneven structure on a surface thereof was obtained in the same manner as Example 6, except for using an acrylic film (manufactured by Mitsubishi Rayon Co., Ltd, HBK-002). The results are shown in Table 2.

Example 10

An article having a fine uneven structure on a surface thereof was obtained in the same manner as Example 7, except for using the active energy beam-curable composition B. The results are shown in Table 2.

Example 11

An article having a fine uneven structure on a surface thereof was obtained in the same manner as Example 7, except for using the roll-shaped mold obtained in Example 2. The results are shown in Table 2.

Example 12

An article having a fine uneven structure on a surface thereof was obtained in the same manner as Example 7, except for using the roll-shaped mold obtained in Example 3. The results are shown in Table 2.

Example 13

An article having a fine uneven structure on a surface thereof was obtained in the same manner as Example 7, except for using the roll-shaped mold obtained in Example 4. The results are shown in Table 2.

Example 14

An article having a fine uneven structure on a surface thereof was obtained in the same manner as Example 6, except for using the roll-shaped mold obtained in Example 5. The results are shown in Table 2.

Example 15

An article having a fine uneven structure on a surface thereof was obtained in the same manner as Example 12, except for using an active energy beam-curable composition C. The results are shown in Table 2.

Comparative Example 4

An article having a fine uneven structure on a surface thereof was obtained in the same manner as Example 7, except for using the roll-shaped mold obtained in Comparative example 1. The results are shown in Table 2.

TABLE 2

| | Mold | Active energy beam-curable composition | Transparent base material | Article Total light transmittance (%) | Haze (%) |
|---|---|---|---|---|---|
| Example 8 | Example 1 | A | PET | 94.1 | 1.9 |
| Example 9 | Example 1 | A | Acrylic | 95.7 | 0.5 |
| Example 10 | Example 1 | B | Acrylic | 95.7 | 0.5 |
| Example 11 | Example 2 | A | Acrylic | 95.6 | 0.5 |
| Example 12 | Example 3 | A | Acrylic | 95.7 | 0.5 |
| Example 13 | Example 4 | A | Acrylic | 95.6 | 0.5 |
| Example 14 | Example 5 | A | PET | 93.9 | 1.9 |
| Example 15 | Example 5 | C | PET | 94.0 | 2.1 |
| Comparative example 4 | Comparative example 1 | A | PET | 93.7 | 2.7 |
| Comparative example 5 | Comparative example 2 | A | Acrylic | 95.2 | 1.0 |

INDUSTRIAL APPLICABILITY

The present invention is useful for efficient mass production of an anti-reflective article, an anti-fogging article, an anti-fouling article, and a water-repellent article.

REFERENCE SIGNS LIST

10 ALUMINUM BASE MATERIAL
12 FINE PORE (FINE UNEVEN STRUCTURE)
14 OXIDE FILM
18 MOLD
20 ROLL-SHAPED MOLD
40 ARTICLE
42 FILM (TRANSPARENT BASE MATERIAL)
46 CONVEX PORTION (FINE UNEVEN STRUCTURE)

The invention claimed is:

1. A mold in which a fine uneven structure is formed on a surface by anodizing a surface of an aluminum base material having a purity of equal to or more than 99.5% by mass, wherein the fine uneven structure is such that a plurality of convex portions are formed on the surface of the mold, the convex portions having shapes in which the cross-sectional areas of the convex portions in a direction perpendicular to the height direction continuously increase from the outermost surface to the depth direction, wherein:
 (1) an average interval between the convex portions is 20 to 400 nm,
 (2) a height of the convex portions is 80 to 500 nm, and
 (3) an aspect ratios of convex portions is 0.5 to 5.0 in terms of a ratio of height of the convex portions to the average interval between the convex portions, and
 wherein a 60-degree gloss of the surface on the side where the fine uneven structure is formed is equal to or more than 750%.

* * * * *